United States Patent
Miyakoshi et al.

(10) Patent No.: US 8,089,539 B2
(45) Date of Patent: Jan. 3, 2012

(54) PHASE ADJUSTING DEVICE AND RELATED ART THEREOF

(75) Inventors: Ryuichi Miyakoshi, Osaka (JP); Mayu Ogawa, Osaka (JP); Masahiro Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 1004 days.

(21) Appl. No.: 12/018,590

(22) Filed: Jan. 23, 2008

(65) Prior Publication Data

US 2008/0174352 A1    Jul. 24, 2008

(30) Foreign Application Priority Data

Jan. 23, 2007 (JP) ................. 2007-012408

(51) Int. Cl.
*H04N 9/077* (2006.01)
*H04N 5/228* (2006.01)
(52) U.S. Cl. ............ 348/285; 348/222.1; 348/281
(58) Field of Classification Search ............ 348/41, 348/181, 285, 222.1, 312
See application file for complete search history.

(56) References Cited

U.S. PATENT DOCUMENTS

| | | | |
|---|---|---|---|
| 4,672,447 A * | 6/1987 | Moring et al. | 348/537 |
| 4,700,219 A * | 10/1987 | Tanaka et al. | 348/223.1 |
| 5,202,586 A | 4/1993 | Hori et al. | |
| 5,940,136 A * | 8/1999 | Abe et al. | 348/537 |
| 6,211,918 B1 * | 4/2001 | Uwabata et al. | 348/458 |
| 7,692,704 B2 | 4/2010 | Hashimoto et al. | |

FOREIGN PATENT DOCUMENTS

| | | | |
|---|---|---|---|
| JP | 07-250288 A | | 9/1995 |
| JP | 2003-037780 A | | 7/2003 |
| JP | 2005-151081 | * | 6/2005 |
| JP | 2005-210701 A | | 8/2005 |

* cited by examiner

*Primary Examiner* — Hung Lam
(74) *Attorney, Agent, or Firm* — McDermott Will & Emery LLP

(57) ABSTRACT

A characteristic detecting unit detects characteristics of a digital imaged signal at every phase shift interval set in advance. A timing adjustment unit gives a phase adjustment instruction of a pulse so as to converge to an imaging phase in the digital imaged signal at which the characteristics are a predetermined value or within a predetermined range. A shift interval switching unit switches the phase shift interval according to photographing conditions of an imaging element.

18 Claims, 10 Drawing Sheets

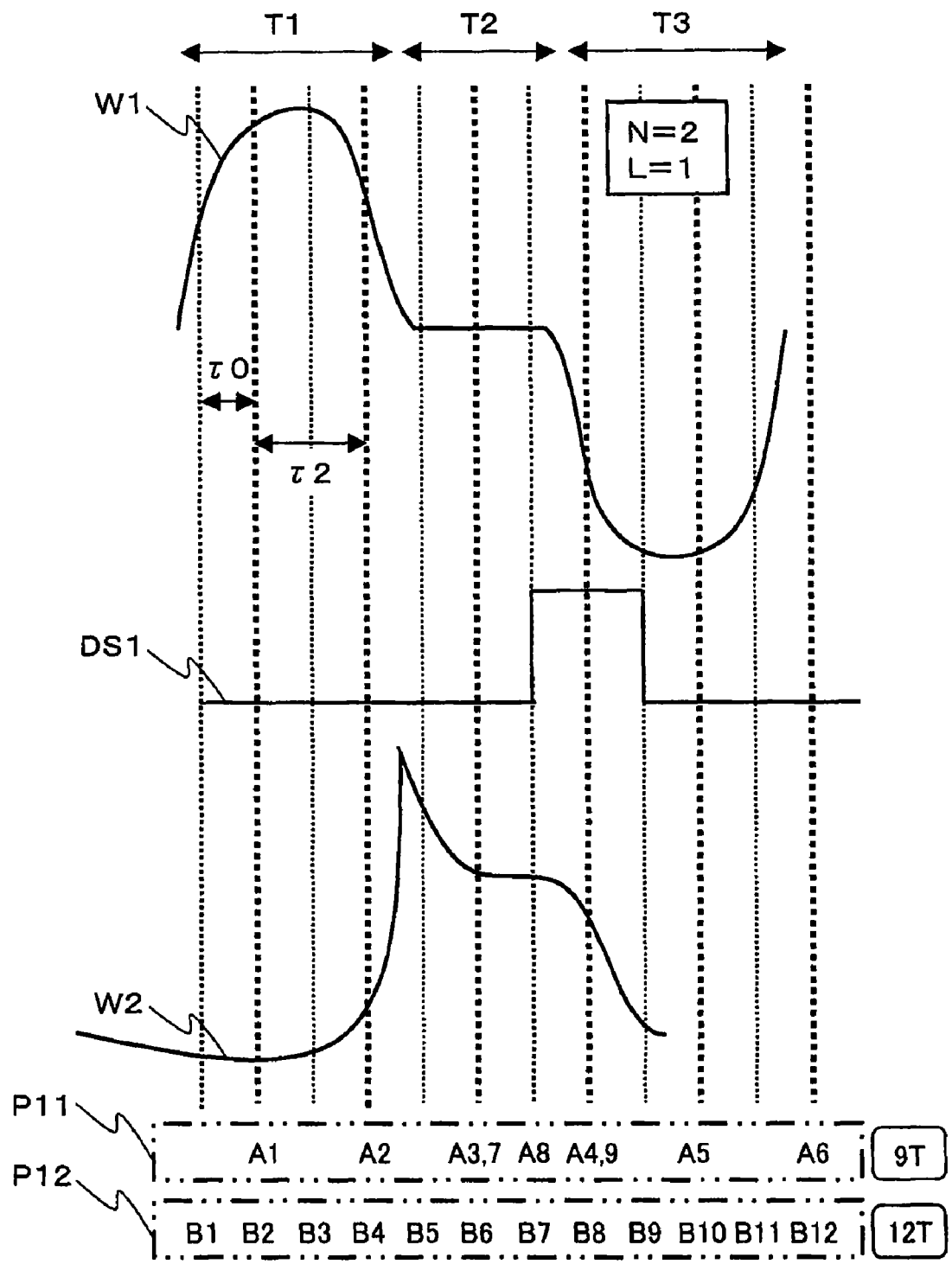
F I G. 7

PHASE ADJUSTING DEVICE AND RELATED ART THEREOF

BACKGROUND OF THE INVENTION

1. Field of the Invention

The present invention relates to a phase adjusting device for performing phase (timing) adjustment of a pulse used for imaging in a digital camera, and a digital camera incorporating the phase adjusting device. The present invention also relates to a phase adjustment driving device, and a phase adjusting method. The main pulse which is a target of the phase adjusting technique of the present invention is at least one of a peak sample pulse for detecting a level of an imaged signal output from an imaging element, a reference sample pulse for detecting a signal level that becomes a reference of correlated double sampling, and an AD clock signal output to an external AD converter.

2. Description of the Related Art

In digital cameras (digital still camera, digital video camera, portable telephone with camera, and the like), an analog imaged signal that is imaged by an imaging element such as a CCD and a MOS sensor is converted to a digital imaged signal, and such a digital imaged signal is recorded after being subjected to a predetermined signal process. The pulse for driving the imaging element, the pulse for detecting the signal level, and the like are required to image a subject with the imaging element. Since the phases of such pulses is subject to variations originating from manufacturing, it is difficult to adjust the pulse phase when designing hardware. Thus, a technician performs phase adjustment after manufacturing, stores information indicating the adjusted phase in a storage region, and thereafter, users reads out the phase information from the storage region in actual use to set an optimum phase.

A technique of retrieving mostly a noise component with the exposure time at a minimum and adjusting the phase under the condition the high frequency component (noise component) becomes a minimum is conventionally known (see Japanese Laid-Open Patent Publication No. 2005-151081).

In the field of digital cameras, the system incorporating the phase adjusting device is sometimes changed in a wide variety of ways. Particularly, in the field of medial cameras and the like, the imaging element is sometimes replaced after the digital camera is manufactured. If the system incorporating the phase adjusting device or the imaging element differs, the phase of the pulse for driving the different system or element obviously differs, and thus the phase must be readjusted. However, changing of the system incorporating the phase adjusting device and replacement of the imaging element are difficult to be rapidly and easily performed if a technician has to readjust the phase manually.

Although the pulses to be adjusted are of a plurality of types, the optimum phase is obtained with the same method for all the pulses without taking the characteristics of each pulse into consideration in the Japanese Laid-Open Patent Publication mentioned above, and thus the precision is not very high.

The optimum phase also changes depending on external factors such as change in temperature and voltage, and thus it is desirably adjusted every time photographing conditions change. However, the pulse phase adjustment of the prior art is assumed to be performed in time of factory shipment and due consideration has not been given to a case of adjustment being performed by the user, where the adjustment is actually troublesome when performed by the user.

SUMMARY OF THE INVENTION

Therefore, it is a main object of the present invention to provide a phase adjusting device enabling adjustment of a phase of a pulse for driving an imaging element to be performed faster and easier, and furthermore at high precision compared to a case of being performed manually by a technician, and capable of responding to phase adjustment required in high speed photography with fast shutter speed.

A phase adjusting device of the present invention for solving the above problems adjusts a phase of a pulse used in imaging of an analog imaged signal based on a digital imaged signal obtained by converting the analog imaged signal obtained by an imaging element to a digital value for every pixel, the phase adjusting device including a characteristic detecting unit for detecting characteristics of the digital imaged signal at every phase shift interval set in advance; a timing adjustment unit for giving a phase adjustment instruction of the pulse so as to converge to an imaging phase in the digital imaged signal at which the characteristics are at a predetermined value or within a predetermined range; and a shift interval switching unit for switching the phase shift interval according to photographing conditions of the imaging element.

In the phase adjusting device of such a configuration, the characteristic detecting unit detects the characteristic with respect to a digital imaged signal of a plurality of pixels within a predetermined pixel region and provides the obtained characteristic information to the timing adjustment unit. The timing adjustment unit obtains the optimum phase of the pulse based on the received characteristic information and gives a phase adjustment instruction of the pulse to a timing generator etc. so that an imagining phase converges to the obtained optimum phase. The phase adjustment of the pulse based on the characteristic information is suited for the phase adjustment of a peak sample pulse for sampling a signal component that reaches its in a signal period, or the phase adjustment of a reference sample pulse for sampling a signal component that becomes a reference in correlated double sampling.

The process of the phase adjustment described above is automatically performed by cooperation of the characteristic detecting unit and the timing adjustment unit. Furthermore, since the characteristic detecting unit actually measures the characteristics in the analog imaged signal obtained from the imaging element and the phase of the pulse is adjusted in view of such characteristics, the precision of the phase adjustment of the pulse for driving the imaging element is high. That is, phase adjustment complying with the current imaging element state can be performed. Since each phase of the pulse for driving the imaging element is automatically adjusted, the time required for the adjustment process can be reduced compared to a case where a technician manually adjusts the phase of the pulse.

In addition, the following effects are produced by arranging a shift interval switching unit.

The shift interval switching unit switches the phase shift interval according to the photographing conditions such as shutter speed and temperature, and instructs the characteristic detecting unit. Furthermore, the shift interval switching unit switches the phase shift interval between a normal adjustment mode and a high speed adjustment of performing phase adjustment at high speed, divides an adjustment stage in the high speed adjustment mode into two stages of a rough adjustment stage and a fine adjustment stage following the rough adjustment stage, and sets a fine adjustment phase shift interval in the fine adjustment stage to an interval smaller than a rough adjustment phase shift interval in the rough adjustment stage.

The characteristic detecting unit sets a rough adjustment stage and a fine adjustment stage to be performed following the rough adjustment stage, detects a first imaging phase at which the characteristics sequentially detected at a rough phase shift interval become a first predetermined value or within a predetermined range in the rough adjustment stage, and detects a second imaging phase at which the characteristics sequentially detected at a fine adjustment phase interval having a narrower interval than the rough adjustment phase shift interval become a second predetermined value or within a second predetermined range with the first imaging phase as a center of the shift in the fine adjustment stage; and the timing adjustment unit adjusts the phase of the pulse so as to converge to the second imaging phase.

Therefore, the number of phase shifts performed until the first imaging phase is detected becomes fewer, and the number of phase shifts performed until the second imaging phase is detected after the detection of the first imaging phase also becomes fewer. Higher speed for the approach to the optimum phase is realized by combining the rough adjustment stage and the fine adjustment stage.

In producing the above effects, the phase adjusting device of the present invention includes a mode in which the shift interval switching unit switches the phase shift interval between a normal adjustment mode and a high speed adjustment of performing phase adjustment at high speed, divides an adjustment stage in the high speed adjustment mode into two stages of a rough adjustment stage and a fine adjustment stage following the rough adjustment stage, and sets a fine adjustment phase shift interval in the fine adjustment stage to an interval smaller than a rough adjustment phase shift interval in the rough adjustment stage.

Furthermore, the phase adjusting device of the present invention includes a mode in which the characteristic detecting unit sets a rough adjustment stage and a fine adjustment stage to be performed following the rough adjustment stage, detects a first imaging phase at which the characteristics sequentially detected at a rough phase shift interval become a first predetermined value or within a predetermined range in the rough adjustment stage, and detects a second imaging phase at which the characteristics sequentially detected at a fine adjustment phase interval having a narrower interval than the rough adjustment phase shift interval become a second predetermined value or within a second predetermined range with the first imaging phase as a center of the shift in the fine adjustment stage; the timing adjustment unit adjusts the phase of the pulse o as to converge to the second imaging phase; and the shift interval switching unit is omitted.

This mode is equivalent to a case where the shift interval switching unit described above is not particularly necessary. The object is to speed up the approach to the optimum phase irrespective of the photographing conditions by combining the rough adjustment stage and the fine adjustment stage.

The phase adjusting device of the present invention include
  a mode in which the fine adjustment phase shift interval is a minimum unit interval of a phase shift, and the rough adjustment phase shift interval is an integral multiple of the fine adjustment phase shift interval, where the integer is greater than or equal to two;
  a mode in which the rough adjustment phase shift interval is variable and the speed of phase adjustment can be freely controlled; and
  a mode in which at least one of the rough adjustment stage and the fine adjustment stage is repeated a plurality of times so that the phase at which the luminance level is instantaneously raised by noise etc. is prevented from being falsely determined as the optimum phase and the precision of phase adjustment is enhanced.

The pulse is at least one of a peak sample pulse for detecting a level of the analog imaged signal and a reference sample pulse for detecting a signal level that becomes a reference when performing correlated double sampling on the analog imaged signal. If the peak sample pulse is the pulse to be adjusted, the phase at which the characteristic (luminance level) is the maximum is assumed to be a tentative optimum phase or an optimum phase. If the reference sample pulse is the pulse to be adjusted, the center of a stable region in a case where the luminance level is in the stable region is assumed to be a tentative optimum phase or an optimum phase.

The phase adjusting device having the above configuration includes a mode in which the characteristics are at least one of a luminance level of a pixel to be detected sequentially specified for every phase shift interval and signal variance of a plurality of pixels sequentially specified for every phase shift interval. In this mode, higher speed for the approach to the optimum phase is achieved in the phase adjustment of the AD clock signal even if the photographing conditions such as shutter speed and temperature are changed. In this mode, the shift interval switching unit preferably switches the phase shift interval according to photographing conditions. Furthermore, in this mode, the pulse includes an AD clock signal to be provided to an external AD converter.

A phase adjustment driving device of the present invention includes the phase adjusting device of the present invention described above and a timing generator for generating as the pulse at least one of a peak sample pulse for detecting a peak level of an imaged signal output from an imaging element, a reference sample pulse for detecting a signal level that becomes a reference of correlated double sampling, and an AD clock signal to be provided to an external AD converter.

A digital camera of the present invention includes the phase adjustment driving device of the present invention described above, the imaging element, and a lens unit for collecting the light of a subject image on the imaging element.

A phase adjusting method according to the present invention is a phase adjusting method for adjusting a phase of a pulse used in imaging; the method including the steps of detecting a first imaging phase at which characteristic of an image signal imaged using the pulse of each phase become a first predetermined value or fall within or above a first predetermined range while sequentially shifting the phase of the pulse at a rough adjustment phase shift interval set in advance; and setting a second imaging phase at which the characteristic of the image signal imaged using the pulse of each phase becomes a second predetermined value or within a second predetermined range as an optimum phase while sequentially shifting the phase of the pulse at a fine adjustment phase shift interval smaller than the rough adjustment phase shift interval.

In the phase adjusting method, the characteristic detecting unit actually measures characteristics such as luminance, and the phase of the pulse is adjusted in view of such characteristics in the phase adjustment of the pulse when the system incorporating the phase adjusting device is changed or when the imaging element is replaced, and thus the precision of the phase adjustment of the pulse for driving the imaging element enhances. Since each phase of the pulse for driving the imaging element is automatically adjusted, the time required for the adjustment process can be reduced compared to a case where a technician manually adjusts the phase of the pulse.

The phase adjusting method of the present invention includes, a mode in which the fine adjustment phase shift interval is a minimum unit interval of the phase shift, and the rough adjustment phase shift interval is an integral multiple of the fine adjustment phase shift interval, where the integer is greater than or equal to two; and a mode in which at least one of the step of detecting the first imaging phase and the step of setting the optimum phase is repeated a plurality of times so that the phase at which the luminance level is instantaneously raised by noise etc. is prevented from being falsely determined as the optimum phase and the precision of phase adjustment is enhanced.

The pulse is at least one of a peak sample pulse for detecting a level of the imaged signal and a reference sample pulse for detecting a signal level that becomes a reference when performing correlated double sampling on the imaged signal.

The phase adjusting method of the present invention includes a mode of further including the step of setting a third imaging phase at which the characteristic detected while sequentially shifting the phase of the pulse with the phase shift interval of the pulse fixed becomes a third predetermined value or within a third predetermined range as an optimum phase; wherein setting the second imaging phase or the third imaging phase as the optimum phase is switched according to photographing conditions, so that mode selection appropriate for the photographing conditions such as shutter speed and temperature can be performed.

The characteristics are at least one of a luminance level of a pixel to be detected sequentially specified for every phase shift interval and a signal variance of a plurality of pixels sequentially specified for every phase shift interval. The phase adjustment of the pulse based on variance is suited for phase adjustment of an AD clock signal that is an operation clock for AD converting the analog imaged signal to a digital imaged signal.

According to the present invention, since the luminance is actually measured in the analog imaged signal obtained from the imaging element, and the phase of the pulse is adjusted based thereon, the phase adjustment complying with the current imaging element state can be performed. The precision of the phase adjustment of the pulse thus becomes high. Moreover, since each phase of the pulse is automatically adjusted, the time required for the adjustment process can be reduced compared to a case where a technician manually adjusts the phase of the pulse.

In order to obtain such effects, a phase adjusting device is considered which is configured by:

a luminance level detecting unit for detecting a luminance level of a digital imaged signal for a plurality pixels while sequentially specifying a pixel to be detected at a predetermined phase shift interval; and a timing adjustment unit for performing phase adjustment with a phase at which the luminance level is at a predetermined value or within a predetermined range as an optimum phase of a peak sample pulse or a reference sample pulse according to the detection result of the luminance level from the luminance level detecting unit.

Such a configuration has the following problems since the phase shift interval in sequentially specifying the plurality of pixels is constantly fixed. In order to enhance the precision of the phase adjustment with such a configuration, the phase shift interval has to be set sufficiently small. However, if the phase shift interval is small, it takes a long time to search for the optimum phase, and it is difficult to cope with a case where high speed photographing with fast shutter speed etc. is required. The phase shift interval is set large, on the other hand, to perform the search for the optimum phase at high speed. However, if the phase shift interval is large, the precision of the phase adjustment becomes low.

In the present invention, higher speed for the approach to the optimum phase is achieved, and high speed photographing with fast shutter speed etc. can be satisfactorily responded to with the combination of the rough adjustment stage and the fine adjustment stage.

Since the timing adjustment of the pulse used for imaging in a digital still camera or a medical camera is automatically performed at high speed according to the present invention, the present invention has applicability in at least digital still cameras and medial cameras.

BRIEF DESCRIPTION OF THE DRAWINGS

The invention, together with objects and advantages thereof, may best be understood by reference to the following description of the preferred embodiments and will be apparent from the accompanying claims. Numerous advantages not mentioned in the specification should become apparent to those skilled in the art by implementing the invention.

FIG. 7 is a timing chart of a signal component used in phase adjustment of a reference sample pulse in the first embodiment of the present invention;

DETAILED DESCRIPTION OF THE INVENTION

The embodiment of a digital camera mounted with a phase adjusting device according to the present invention will now be described in detail with reference to the drawings.

First Embodiment

Figure 1:
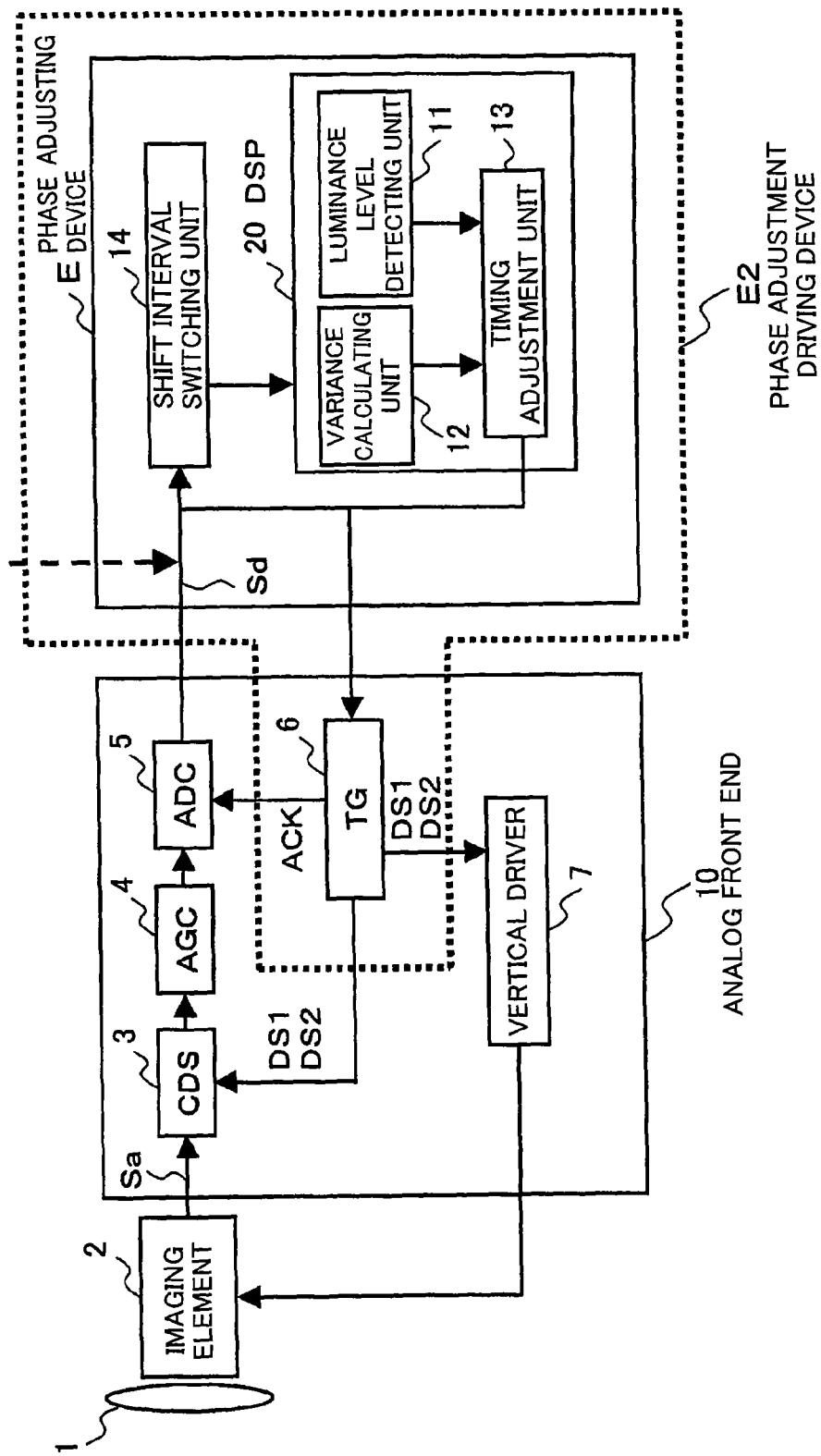
FIG. 1 is a block diagram showing an overall configuration of a digital camera mounted with a phase adjusting device according to a first embodiment of the present invention.

FIG. 1 is a block diagram showing an overall configuration of a digital camera according to a first embodiment of the present invention. The digital camera of the present embodiment includes an optical lens 1 for collecting a subject image on an imaging element 2, the imaging element 2 (CCD is hereinafter described by way of example) for imaging the subject image collected by the optical lens 1, an analog front end 10 for performing a predetermined process on an analog imaged signal Sa output from the imaging element 2 to convert the analog imaged signal Sa to a digital imaged signal Sd, and a DSP (Digital signal Processor) 20 for performing a predetermined process (color correction, YC process, etc.) on the digital imaged signal Sd output from the analog front end 10 to generate an image signal. The imaging element 2 includes a plurality of pixels, which plurality of pixels include an effective pixel region used for imaging the subject and an OB (Optical Black) pixel region arranged in a light shielded state at the periphery of the effective pixel region and used for detecting an OB level.

The analog front end 10 includes a correlated double sampling (CDS) unit 3 for performing correlated double sampling to determine the signal level of the analog imaged signal Sa output from the imaging element 2, an automatic gain controller (AGC) 4 for amplifying the signal output from the correlated double sampling unit 3 with an adjustable gain, an AD converter (Analog Digital Converter) 5 for converting the signal amplified by the automatic gain controller 4 to the digital imaged signal Sd, a timing generator (TG) 6 for generating a pulse used for imaging, and a vertical driver 7 for outputting the pulse generated by the timing generator 6 to the imaging element 2.

The DSP 20 includes a luminance level detecting unit 11 for detecting luminance levels, which is one characteristic of the digital imaged signal Sd, for a plurality of pixels while sequentially specifying the pixel to be detected at a predetermined phase shift interval (rough adjustment phase shift interval or fine adjustment phase shift interval) within a predetermined region; a variance calculating unit 12 for calculating the variance (indicate signal variance between pixels), which is another characteristic of the digital imaged signal Sd, for the plurality of pixels while sequentially specifying the pixel to be detected at a predetermined phase shift interval; a timing adjustment unit 13 for calculating optimum phases of a reference sample pulse DS1, a peak sample pulse DS2, and an AD clock signal ACK based on the detection/calculation results of the luminance level detecting unit 11 and the variance calculating unit 12, and setting the calculated optimum phase in the timing generator 6; and a shift interval switching unit 14 for switching the phase shift intervals in the luminance level detecting unit 11 and the variance calculating unit 12 according to photographing conditions C such as shutter speed and temperature. In the present embodiment, the luminance level detecting unit 11 and the variance calculating unit 12 are examples of a characteristic detecting unit.

The timing generator 6 provides the reference sample pulse DS1 and the peak sample pulse DS2 to the imaging element 2 via the vertical driver 7. The timing generator 6 also provides the pulses DS1 and DS2 to the correlated double sampling unit 3. The timing generator 6 provides the AD clock signal ACK to the AD converter 5. Reference symbol E1 is a phase adjusting device including the DSP 20 and the shift interval switching unit 14, and E2 is a phase adjustment driving device including the phase adjusting device E1 and the timing generator 6.

Figure 2:
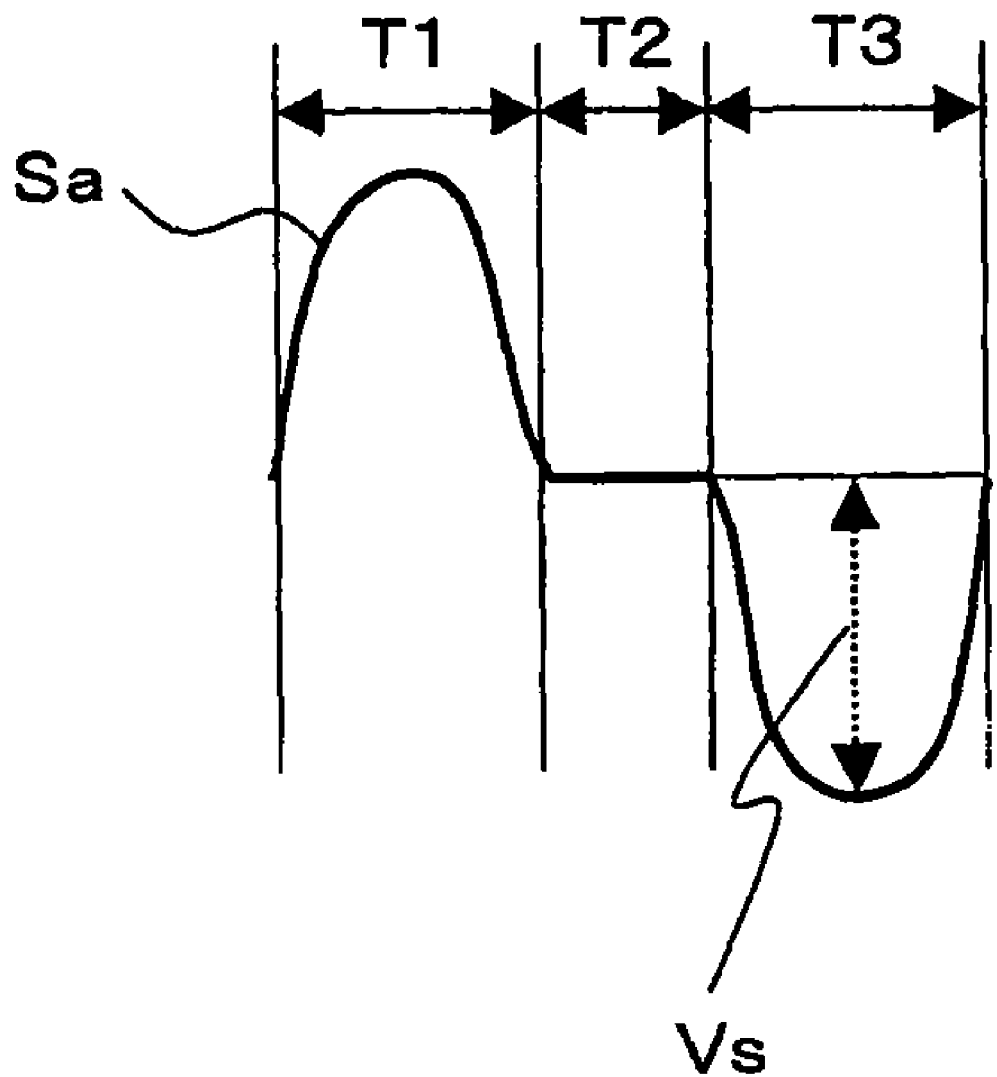
FIG. 2 is a view showing a signal component output from an imaging element in time series.

FIG. 2 is a view showing the analog imaged signal Sa output from the imaging element 2 in time-series. As shown in FIG. 2, the analog imaged signal Sa is configured by a reset period T1, a reference period T2, and a signal period T3. The reset period T1 is a period used to reset the imaging element 2.

The reference period T2 is a period during which the reference voltage is output from the imaging element 2, and is a period for detecting the signal that becomes a reference when the correlated double sampling unit 3 operates. The signal period T3 is a period during which the signal voltage is output, where the signal voltage that reaches its peak in the signal period T3 and the reference voltage in the reference period T2 are sampled and the difference between the voltages is taken to obtain the signal level Vs of the analog imaged signal Sa. In FIG. 2, the downward direction in the figure is defined as the direction the signal component is positive.

Figure 3:
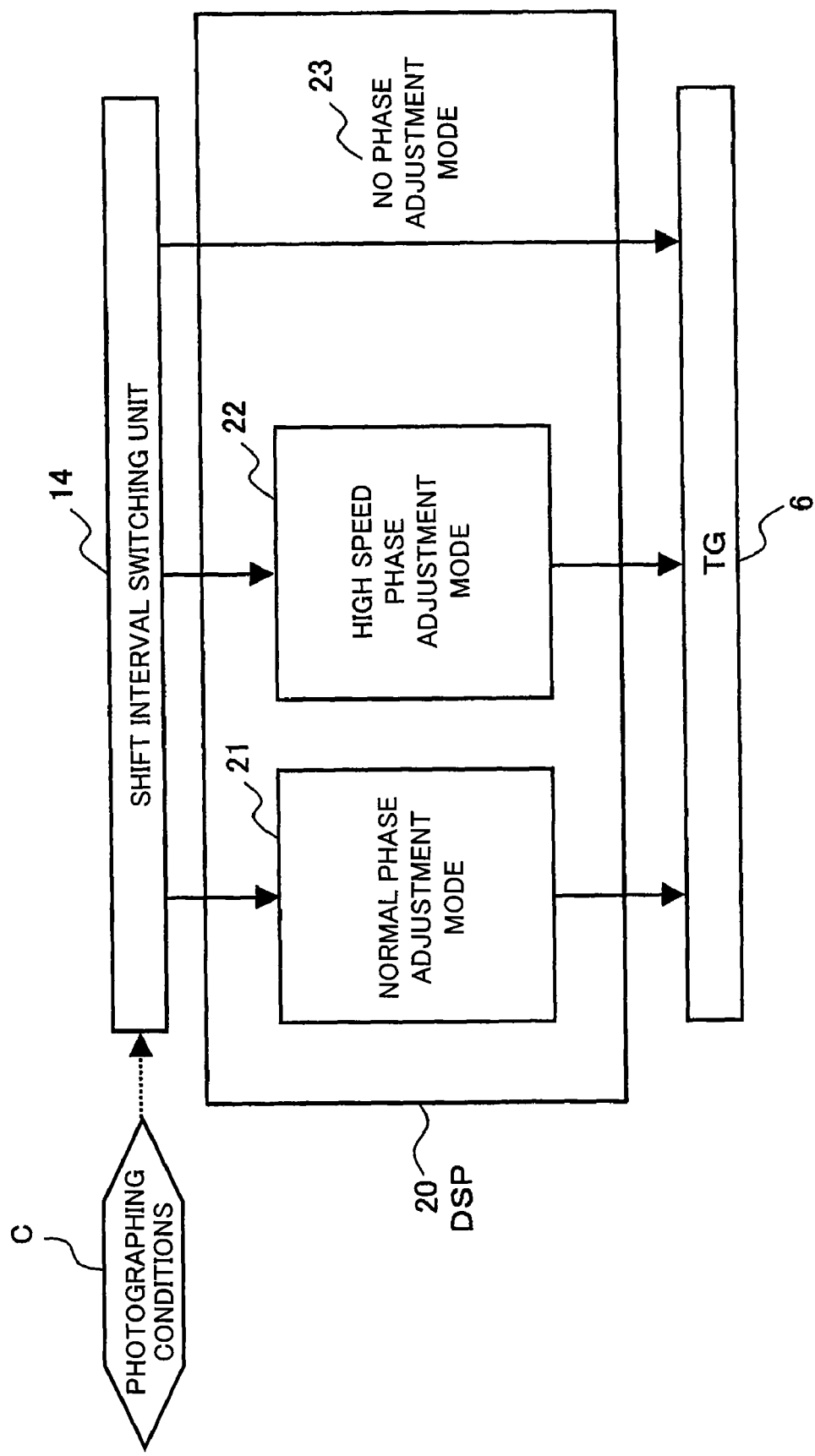
FIG. 3 is a view showing a switching unit of a phase adjusting method according to the first embodiment.

FIG. 3 shows a switching unit of phase adjustment modes in the first embodiment. In FIG. 3, the shift interval switching unit 14 switches the operation mode of the DSP 20 among a normal phase adjustment mode 21, a high speed phase adjustment mode 22, and a no phase adjustment mode 23 based on the photographing conditions C (shutter speed, temperature, and the like).

When the normal phase adjustment mode 21 or the high speed phase adjustment mode 22 is selected by the shift interval switching unit 14 according to the photographing conditions C, the phase adjustment is performed mainly by the luminance level detecting unit 11, the variance calculating unit 12, and the timing adjustment unit 13. The pulse to be adjusted in the present embodiment is the reference sample pulse DS1, the peak sample pulse DS2, and the AD clock signal ACK. The reference sample pulse DS1 is a pulse for sampling the signal component that becomes a reference in correlated double sampling. Therefore, phase adjustment is desirably performed in the reference sample pulse DS1 so that the rising edge appears at the center of the reference period. The peak sample pulse DS2 is a pulse for sampling the signal component that reaches its peak in the signal period T3. Therefore, phase adjustment is desirably performed in the peak sample pulse DS2 so that the rising edge appears when the signal component output from the imaging element 2 reaches its peak. The AD clock signal ACK is a clock signal for the operation of the AD converter 5, where phase adjustment is desirably performed so that the result of AD conversion does not vary. The signal level Vs calculated by the correlated double sampling unit 3 is merely the difference between the signal component of the peak at the rise of the peak sample pulse DS2 and the signal component within the reference period defined by the rise of the reference sample pulse DS1.

Figure 4:
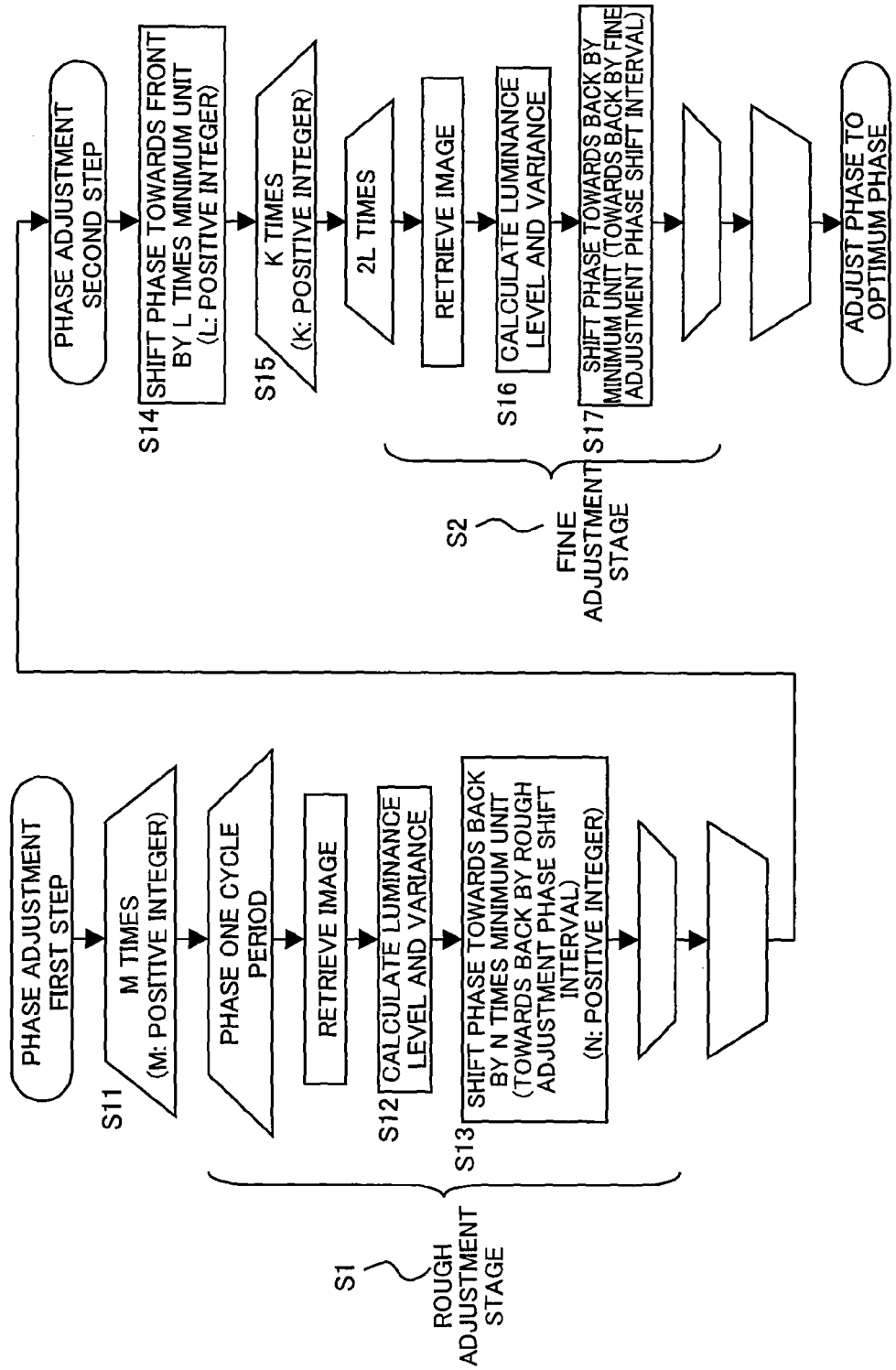
FIG. 4 is a flowchart showing the operation in time of high speed phase adjustment mode in the embodiment of the present invention.

FIG. 4 is a flowchart showing the operation in time of a high speed phase adjustment mode. In FIG. 4, the high speed phase adjustment mode includes a rough adjustment stage S1 and a fine adjustment stage S2. First, in the rough adjustment stage S1, the characteristics (luminance level, variance, etc.) of the digital imaged signal necessary for determining the optimum phase of each pulse are calculated (step S12), and the phase is shifted towards the back at the phase shift interval (rough adjustment phase shift interval) of N times (N: integer greater than or equal to 2) a minimum unit interval $\tau 0$ of the phase shift (step S13). Step S12 and step S13 are repeated over a period of one cycle to detect a first imaging phase indicating the optimum phase in the rough adjustment stage S1.

In the fine adjustment stage S2, the first imaging phase detected in the rough adjustment stage S1 is shifted towards the front at the phase shift interval of L times (L: integer greater than or equal to 1) the minimum unit interval $\tau 0$ of the phase shift (step S14). Thereafter, the characteristics (luminance level, variance, etc.) of the digital imaged signal necessary for determining the final optimum phase are calculated (step S16), and the phase is further shifted towards the back at the fine adjustment phase shift interval (minimum unit interval of phase shift) τ0 (step S17). The process of step S16 and the process of step S17 are repeated 2L times to detect a second imaging phase indicating the optimum phase in the fine adjustment stage S2. The second imaging phase detected in the fine adjustment stage S2 is determined as the final optimum phase of each pulse. The processes are repeated 2L times to symmetrically examine the first imaging phase detected in the rough adjustment stage S1 at both the front and the back. The number of repetitions of 2L times is the total value of L times at the front of the tentative optimum phase and L times at the back of the tentative optimum phase.

At least one of the rough adjustment stage S1 and the fine adjustment stage S2 is repeated (step S11, S15) based on the photographing conditions C (shutter speed, temperature, etc.) to determine the optimum phase in each pulse. The repetition of the rough adjustment stage S1 is M times (M: integer greater than or equal to 2), and the repetition of the fine adjustment stage S2 is K times (K: integer greater than or equal to 2).

The determination of the optimum phase of each pulse in a case where the high speed phase adjustment mode 22 is selected by the shift interval switching unit 14 will be described below. The optimum phases in the reference sample pulse DS1, the peak sample pulse DS2, and the AD clock signal ACK change when there is change in temperature in time of imaging due to change in temperature by seasons, change in temperature between home and travel destination, etc. The shift interval switching unit 14 selects the high speed phase adjustment mode 22 when a temperature change greater than or equal to a certain value is detected by a temperature detector (not shown). Alternatively, the shift interval switching unit 14 selects the high speed phase adjustment mode 22 when high speed photography with fast shutter speed is requested by the user.

Figures 5A, 5B:
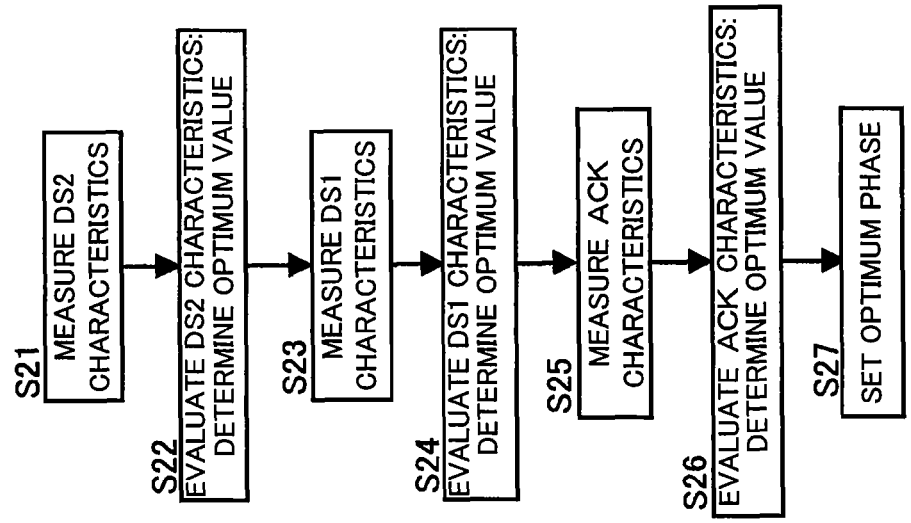
FIG. 5A is a flowchart showing the overall operation of the phase adjustment in the embodiment of the present invention.
FIG. 5B is a view showing adjustment progress at set values of each pulse in time of adjustment.

FIG. 5 shows a flowchart showing the overall operation of phase adjustment of each pulse. First, the characteristics of the digital imaged signal necessary for determining the phase of the peak sample pulse DS2 are measured while shifting the phase of the peak sample pulse DS2 from an initial value with the phases of the reference sample pulse DS1 and the AD clock signal ACK fixed at initial values defined in advance (step S21). The characteristics measured in step S21 are then evaluated to determine an optimum phase of the peak sample pulse DS2 (step S22). After the phase of the peak sample pulse DS2 is determined, the characteristics of the digital imaged signal necessary for determining the phase of the reference sample pulse DS1 are measured while shifting the phase of the reference sample pulse DS1 from the initial value with the phase of the peak sample pulse DS2 fixed at the determined optimum value and the phase of the AD clock signal ACK still fixed at the initial value (step S23). The characteristics measured in step S23 are then evaluated to determine an optimum phase of the reference sample pulse DS1 (step S24). After the phases of the reference sample pulse DS1 and the peak sample pulse DS2 are determined, the characteristics of the digital imaged signal necessary for determining the phase of the AD clock signal ACK are measured while shifting the phase of the AD clock signal ACK from the initial value with the pulses DS1, DS2 fixed at the optimum values (step S25). The data measured in step S25 is then evaluated to determine an optimum phase of the AD clock signal ACK (step S26). After the optimum phases of the reference sample pulse DS1, the peak sample pulse DS2, and the AD clock signal ACK are determined, information related to the determined optimum phases are set in a register in the timing generator 6 (step S27). The pulses converged to the respective optimum phase are thereby generated.

Specific details of the phase adjustment of the peak sample pulse DS2, the reference sample pulse DS1, and the AD clock signal ACK will now be described.

(Phase Adjustment of Peak Sample Pulse DS2)

Figure 6:
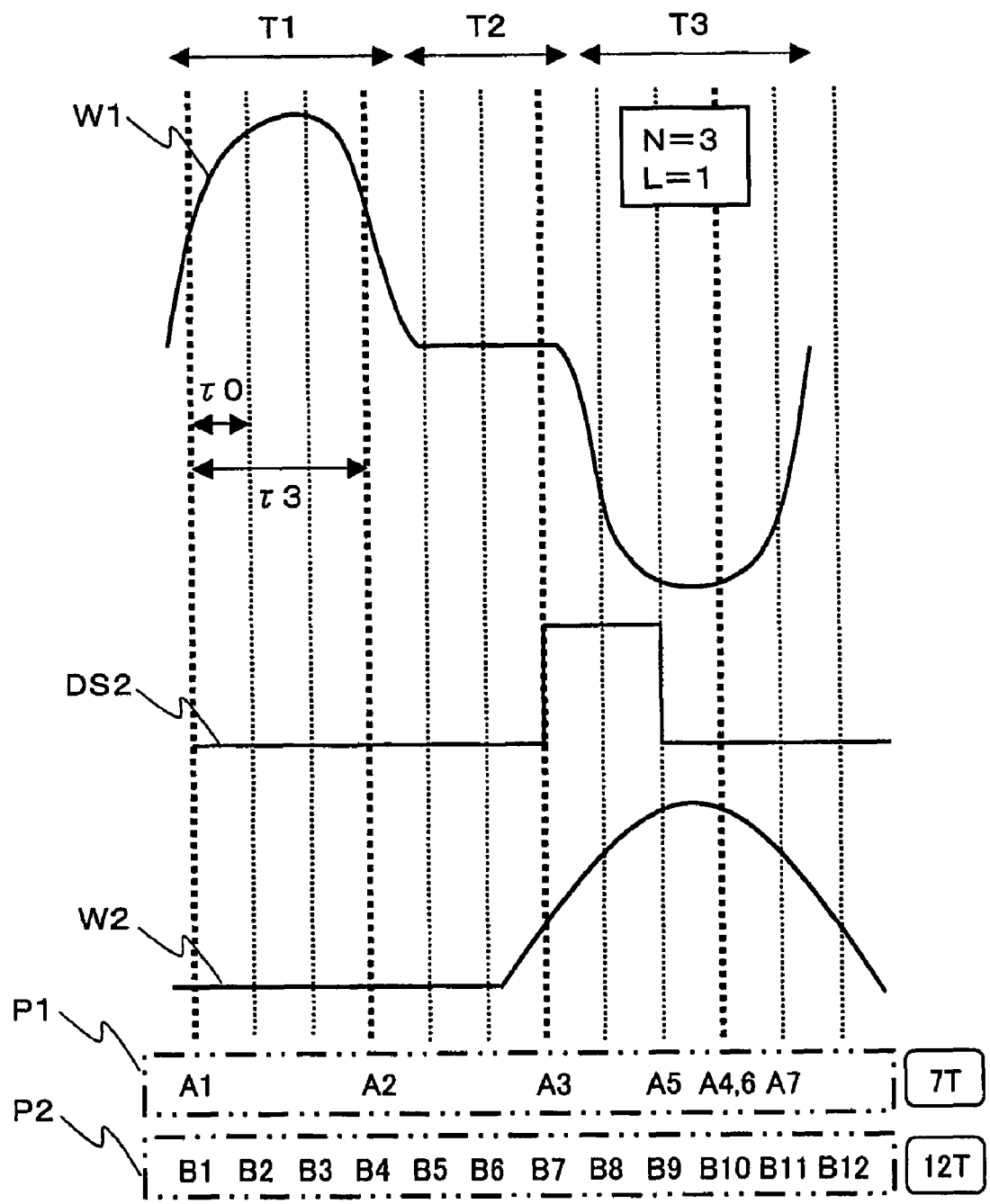
FIG. 6 is a timing chart of a signal component used in phase adjustment of a peak sample pulse in the first embodiment of the present invention.

FIG. 6 shows a timing chart of a signal component used in the phase adjustment of the peak sample pulse DS2. In FIG. 6, W1 indicates the output signal of the imaging element and W2 indicates the luminance level, where N=3 and L is L=1 as N and L used in FIG. 4. The luminance in the phase adjustment of the peak sample pulse DS2 is defined as an average value of the signal level of each pixel selected in a partial region or an entire region (referred to as peak sample pulse detection region) of the effective pixel region of the imaging element 2.

In the rough adjustment stage S1, the phase of the peak sample pulse DS2 is shifted at the rough adjustment phase shift interval (interval of three times the minimum unit interval of the phase shift) T3 in such a way as A1 to A4 of P1 with the phases of the reference sample pulse DS1 and the AD clock signal ACK fixed to detect the phase at which the luminance level W2 becomes a maximum in the luminance level calculation (S12), and such a phase is assumed to be the first imaging phase in the rough adjustment stage S1. In this example, A4 of P1 is detected as the first imaging phase in the rough adjustment stage S1.

The phase at which the luminance level W2 becomes a maximum in the luminance level calculation (S12) is detected as a second imaging phase while shifting the phase of the peak sample pulse DS2 towards the front and the back from the first imaging phase calculated in the rough adjustment stage S1 at the fine adjustment phase shift interval (minimum unit interval of the phase shift) τ0 in such a way as A5 to A7 of P1. Here, A6 of P1 is detected as the second imaging phase in the fine adjustment stage S2. The second imaging phase (A6 of P1) is determined as the optimum phase of the peak sample pulse DS2.

In the rough adjustment stage S1 described above, the rough adjustment phase shift interval is made to be an interval τ3 which is three times the minimum unit interval because the predicted position of the phase of the peak sample pulse DS2 is predicted to be in the signal period T3 and not in the reset period T1 nor the reference period T2. Therefore, in the present invention, the phase is advanced at a sufficiently large rough adjustment phase shift interval based on the idea that search in the reset period T1 and the reference period T2 may be rough. Since the precision of the first imaging phase is low even if calculated in the signal period T3, the fine adjustment phase shift interval τ0 is used in the fine adjustment stage S2 as the minimum unit interval to search in a dense state. In this case, both the front and the back of the first imaging phase in the rough adjustment stage S1 have to be examined, and thus the search is performed after returning by L times the minimum unit interval τ0. This is repeated 2L times to symmetrically examine the tentative optimum phase in the rough adjustment stage S1 at both the front and the back. Specifically, a total of 2L times is required because the examination is performed L times each at the front and the back of the tentative optimum phase.

In the adjustment stages S1 and S2, the time required for the phase adjustment of the peak sample pulse DS2 is 7T as shown in P1 (A1 to A7), where T is the time required to shift the phase once. The time required for the conventional phase adjustment is 12T as shown in P2 (B1 to B12) since the shift is performed at the minimum unit interval τ0 of the phase shift over a period of one cycle. Therefore, the required time can be saved by 5T by performing the phase adjustment in two stages of the rough adjustment stage S1 and the fine adjustment stage S2, whereby high speed phase adjustment is realized.

(Phase Adjustment of Reference Sample Pulse DS1)

FIG. 7 shows a timing chart of a signal component used in the phase adjustment of the reference sample pulse DS1. In FIG. 7, N=2 and L=1. In the phase adjustment of the reference sample pulse DS1 as well, the luminance is defined as an average value of the signal level of each pixel selected in a partial region or an entire region (referred to as reference sample pulse detection region) of the effective pixel region of the imaging element 2.

In the rough adjustment stage S1, the phase of the reference sample pulse DS1 is shifted at an interval τ2 which is two times the minimum unit interval τ0 of the phase shift in such a way as A1 to A6 of P11 with the phases of the peak sample pulse DS2 and the AD clock signal ACK (rough adjustment shift interval) fixed, where when the difference between the luminance level W2 calculated in the luminance level calculation (S12) and the luminance level W2 calculated in the previous phase becomes a first predetermined value or within a first predetermined range (range of values smaller than or equal to the first predetermined value), the relevant phase is determined as tentatively being within a stable region. After shifting the phase by one cycle, the phase at the center of the detected stable region is assumed to be the first imaging phase in the rough adjustment stage S1. Here, A8 of P11 is detected as the tentative optimum phase in the rough adjustment stage S1.

The phase of the reference sample pulse DS1 is shifted towards the front and the back from the first imaging phase calculated in the rough adjustment stage S1 at the fine adjustment phase shift interval (minimum unit interval of phase shift) τ0 in such a way as A7 to A9 of P11, where when the difference between the luminance level W2 calculated in the luminance level calculation (S12) and the luminance level W2 calculated in the previous phase becomes a second predetermined value or within a second predetermined range (range of values smaller than or equal to the second predetermined value), the phase is determined as totally being within the stable region. After shifting the phase a predetermined number of times, the phase at the center of the detected stable region is assumed to be the optimum phase in the fine adjustment stage S2. Here, A8 of P11 is detected as the second imaging phase in the fine adjustment stage S2, and the second imaging phase is determined as the optimum phase of the reference sample pulse DS1.

In the rough adjustment stage S1 described above, the phase shift interval is made to be an interval τ2 which is two times the minimum unit interval τ0 because the predicted position of the phase of the reference sample pulse DS1 is predicted to be in the reference period T2 and not in the reset period T1. Therefore, in the present invention, the phase is advanced at a large phase shift interval based on the idea that search in the reset period T1 may be rough. Since the precision of the first imaging phase is low even if calculated in the reference period T2, the fine adjustment phase shift interval (minimum unit interval) τ0 is used as the phase shift interval in the fine adjustment stage S2 to search in a dense state.

Where T is the time required to shift the phase once, the time required for the phase adjustment of the reference sample pulse DS1 is 9T as shown in P11 (A1 to A9). The time required for the conventional phase adjustment is 12T as shown in P12 (B1 to B12) since shift is performed at the minimum unit interval τ0 of the phase shift over a period of one cycle. Therefore, the required time can be saved by 3T by performing the phase adjustment in two stages of the rough adjustment stage S1 and the fine adjustment stage S2, whereby high speed phase adjustment is realized.

(Phase Adjustment of AD Clock Signal ACK)

Figure 8:
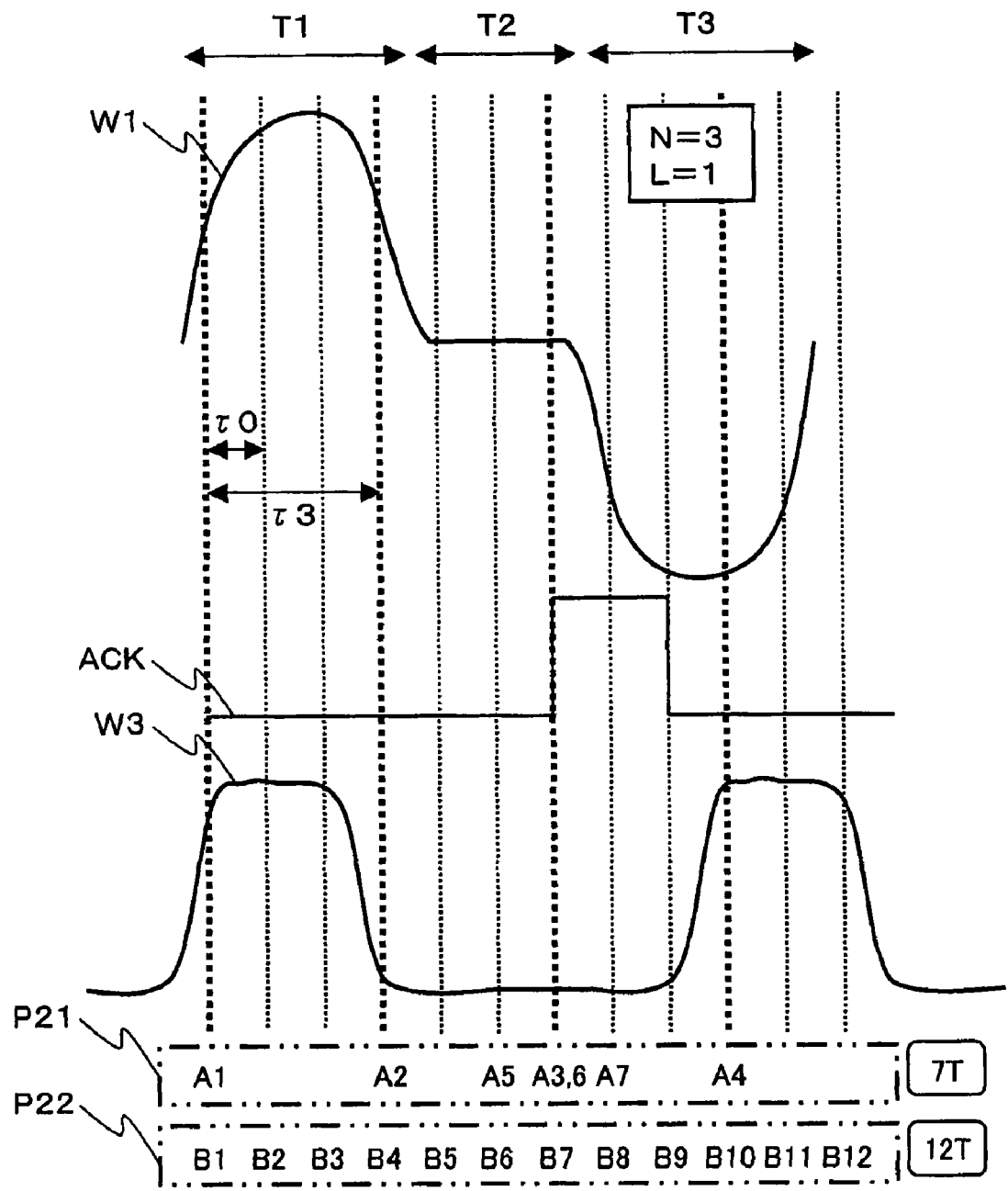
FIG. 8 is a timing chart of a signal component used in phase adjustment of an AD clock signal in the first embodiment of the present invention.

FIG. 8 shows a timing chart of a signal component used in the phase adjustment of the AD clock signal ACK. In FIG. 8, W1 indicates the output signal of the imaging element and W3 indicates variance. Variance referred to herein is defined as variance of the signal level of each pixel in a partial region or an entire region (referred to as AD clock signal detection region) of the effective pixel region and/or OB pixel region with the imaging element 2 light shielded. That is, variance is a value indicating the extent of variation of the signal level of each pixel which is constant in an ideal condition since the imaging element 2 is light shielded. Therefore, the phase of the AD clock signal ACK needs to be set so that the variance W3 becomes small. In FIG. 8, N=3 and L=1.

In the rough adjustment stage S1, the phase of the AD clock signal ACK is shifted at the rough adjustment phase shift interval (interval that is three times the minimum unit interval τ0 of the phase shift) τ3 in such a way as A1 to A4 of P21 with the phases of the reference sample pulse DS1 and the peak sample pulse DS2 fixed at the optimum values to detect the phase at which the variance W3 takes a minimum value in the variance calculation (S12). The phase at which the variance W3 takes a minimum value should be determined as the first imaging phase of the AD clock signal ACK, but the variance W3 sometimes may become a minimum at a wrong position for some reason. Therefore, the luminance in the AD clock signal detection region is compared with a predetermined expected value at the phase the variance W3 is determined as a minimum. Since the OB pixel region is light shielded, there is an expected value serving as the DC offset in the design specification. If the luminance in the AD clock signal detection region is far off from the expected value, the phase of the AD clock signal at the time cannot be assumed to be optimum for the first imaging phase. Therefore, when the difference between the luminance and the predetermined expected value is smaller than or equal to a certain threshold value at the phase the variance W3 is determined as a minimum, the phase is assumed to be the first imaging phase in the rough adjustment stage S1. However, if the difference between the luminance and the predetermined expected value is greater than the certain threshold value, determination is made on whether the difference between the luminance and the predetermined expected value is smaller than or equal to a certain threshold value at the phase the variance W3 is the next smallest. Here, A3 of P21 is detected as the first imaging phase in the rough adjustment stage S1.

The phase of the AD clock signal ACK is shifted at the fine adjustment shift interval (minimum unit interval of the phase shift) τ0 in such a way as A5 to A7 of P21 to detect the phase at which the variance W3 becomes a minimum value, and the luminance at the phase is compared with the predetermined expected value. If the difference between the luminance and the predetermined expected value is smaller than or equal to a predetermined threshold value, the phase is determined as the optimum phase of the second imaging phase in the fine adjustment stage S2. However, if the difference between the luminance and the predetermined expected value is greater than the predetermined threshold value, the difference between the luminance and the predetermined expected value is compared with the predetermined threshold value at the phase the variance W3 is the next smallest. If the difference between the luminance and the predetermined expected value is smaller than or equal to the predetermined threshold value, the relevant phase is determined as the optimum phase, that is, the second imaging phase in the fine adjustment stage S2.

Such processes are repeated, and the second imaging phase in the fine adjustment stage S2 is determined as the optimum phase of the AD clock signal ACK. Here, A7 of P21 is determined as the optimum phase of the AD clock signal ACK.

In the adjustment stages S1 and S2 described above, the time required for the phase adjustment of the AD clock signal ACK is 7T as shown in P21 (A1 to A7), where T is the time required to shift the phase once. The time required for the conventional phase adjustment is 12T as shown in P22 (B1 to B12) since the shift is performed at the minimum unit interval τ0 of the phase shift over a period of one cycle. Therefore, the required time can be saved by 5T by performing the phase adjustment in two stages of the rough adjustment stage S1 and the fine adjustment stage S2, whereby high speed phase adjustment is realized.

The total value of the times P1, P11, and P21 required for the two-stage phase adjustment of the reference sample pulse DS1, the peak sample pulse DS2, and the AD clock signal ACK, respectively, becomes 7T+9T+7T=23T. Conventional phase adjustment required 12T+12T+12T=36T. Thus, the required time can be saved by 13T overall by performing the two-stage phase adjustment, whereby high speed phase adjustment is realized.

Figure 9:
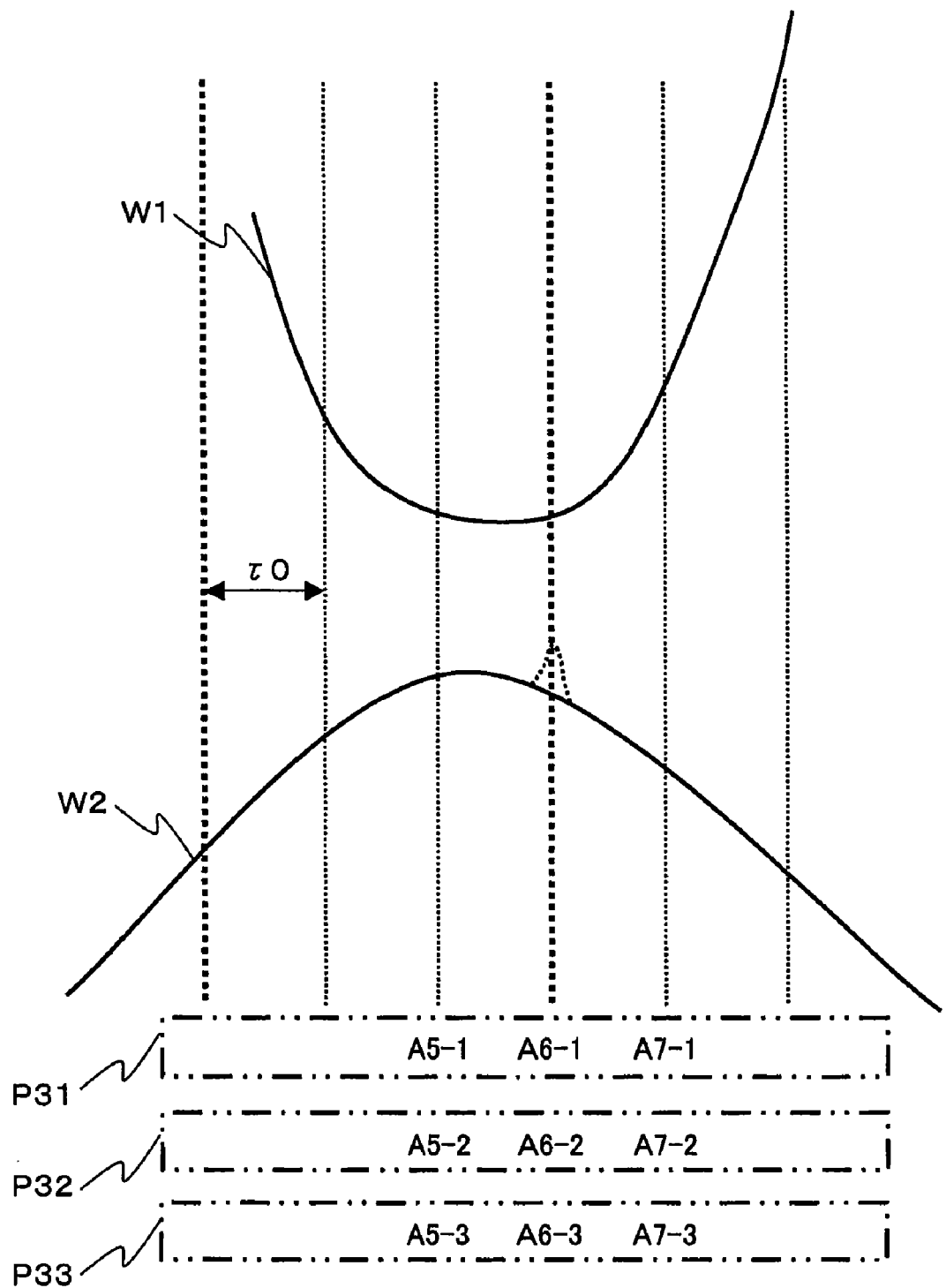
FIG. 9 is a view showing an example in a case where a fine adjustment stage in the phase adjustment of the peak sample pulse is performed three times in the first embodiment of the present invention.

A case of repeating the fine adjustment stage S2 of the peak sample pulse DS2 three times (in step S15, K=3) will be described with reference to FIG. 9. FIG. 9 is an enlarged view of the region of the phases A5 to A7 of P1 in FIG. 6.

In the fine adjustment stage S2, the phase of the peak sample pulse DS2 is shifted at the fine adjustment phase shift interval (minimum unit interval) τ0 of the phase shift in such a way as A5-1 to A7-1 of P31, and the phase at which the luminance level W2 becomes a maximum in the luminance level calculation (S12) is detected. Here, the phase A6-1 is detected in P31.

Similarly, A5-2 is detected as the phase at which the luminance level W2 becomes a maximum in A5-2 to A7-2 of P32, and A5-3 is detected as the phase at which the luminance level W2 becomes a maximum in A5-3 to A7-3 of P33.

In this case, the averages of the luminance levels W2 measured three times at both A5 (two times) and A6 (one time) are calculated, and the calculated average values are compared. If the relationship between the average value X of the luminance levels W2 of A5 and the average value Y of the luminance levels W2 of A6 is X>Y, A5 is detected as the second imaging phase in the fine adjustment stage S2, and such the second imaging phase is determined as the optimum phase of the peak sample pulse DS2. The processes are repeated in such a manner since the peak of A6 is caused by noise.

According to the foregoing adjusting method, the phase at which the luminance level instantaneously rises due to noise etc., is prevented from being falsely determined as the optimum phase. That is, the optimum phase of the peak sample pulse can be properly determined as A5, and the precision of the phase adjustment can be enhanced.

When the phase is determined after the fine adjustment stage S2 is repeated three times for the phase adjustment of the peak sample pulse DS2 and it is carried out only once for the phase adjustment of the reference sample pulse DS1 and the AD clock signal ACK, the total time required for the phase adjustment is 13T+9T+7T=29T, where T is the time required to shift the phase once. Therefore, the phase is adjusted faster by 7T than the time 36T required in the conventional phase adjustment. Furthermore, the precision of the phase adjustment of the peak sample pulse DS2 is enhanced. The same is true of the reference sample pulse DS1 and the AD clock signal ACK.

According to the method described above, each phase of the reference sample pulse DS1, the peak sample pulse DS2, and the AD clock signal ACK can be automatically adjusted. Therefore, the phase of the pulse output from the timing generator 6 can be automatically adjusted by specifying an appropriate signal (color) or a cycle and a phase adjusting amount in the user specification and in time of manufacturing the product even when the system incorporating a phase adjusting device is changed, when the imaging element 2 itself is replaced, or when the characteristics of the imaging element 2 are changed due to external factors (temperature, aging deterioration, and the like). Furthermore, since the phases of the pulses are adjusted at the optimum conditions in terms of image quality and speed through individual methods taking the characteristics of each pulse into consideration, automatic adjustment of high precision and high speed can be realized.

According to the present embodiment described above, since phase adjustment is performed on all of the reference sample pulse DS1, the peak sample pulse DS2, and the AD clock signal ACK, and the phase of the pulse is adjusted through an individual method in view of the characteristics of each pulse, automatic adjustment of high precision can be realized.

The phase of the pulse output from the timing generator 6 can be automatically adjusted even if the characteristics of the imaging element 2 are changed by external factors (temperature, aging deterioration, and the like) and high speed photography with fast shutter speed is required.

Only one or two of the three pulses may be adjusted. The luminance level detecting unit 11, the variance calculating unit 12, and the timing adjustment unit 13, which are components, may be configured as hardware by circuits, or may be realized as software using a microcomputer. In addition, the embodiments described above are merely examples, and it should be recognized that various modifications may be made. The following variants are also possible in enhancing the precision of the two-stage phase adjustment of the AD clock signal ACK.

Second Embodiment

Figure 10:
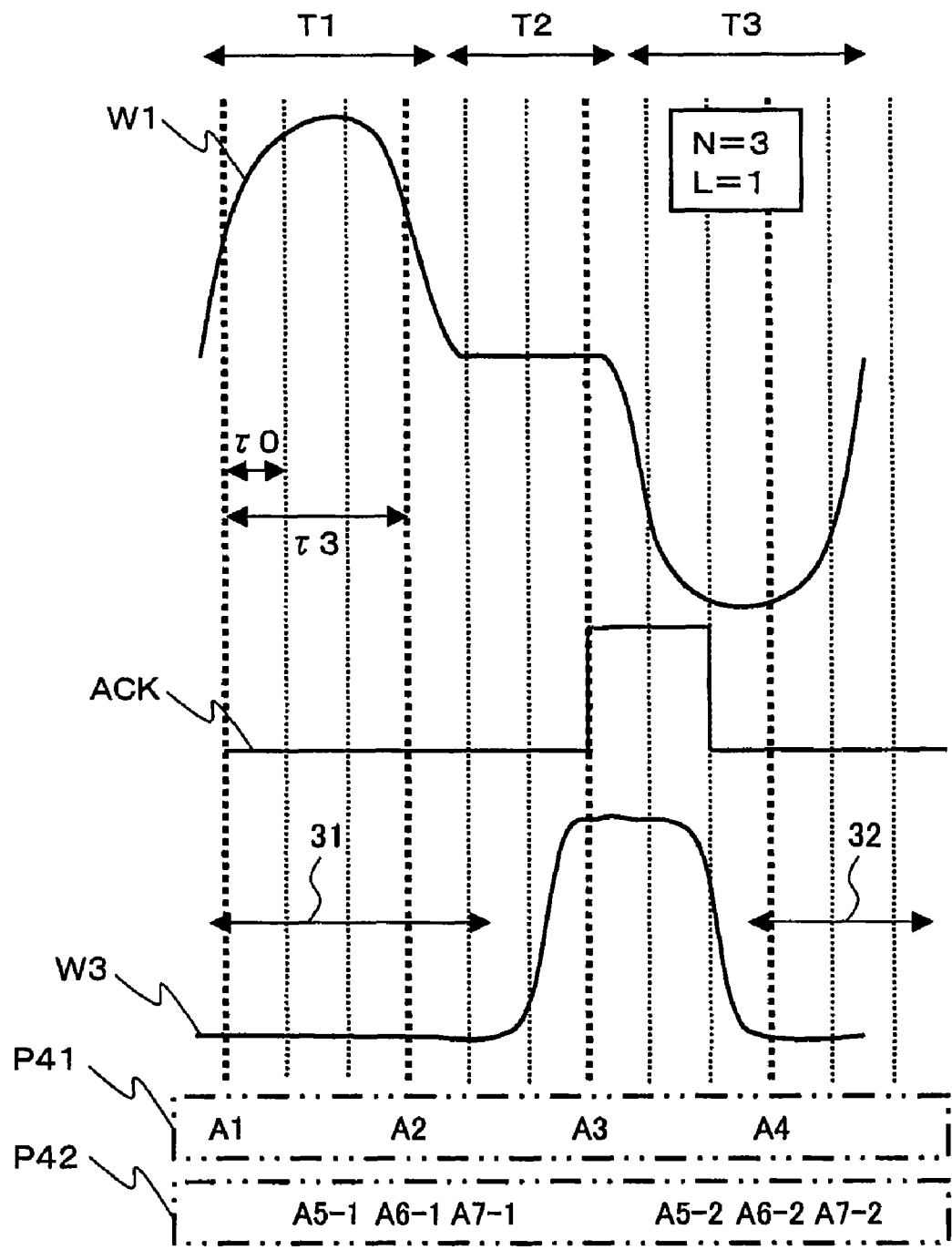
FIG. 10 is a timing chart of a signal component used in phase adjustment of the AD clock signal in a second embodiment of the present invention.

The second embodiment of the present invention further enhances the precision of the phase adjustment of the AD clock signal ACK. FIG. 10 is a view showing a timing chart of a signal component used in the phase adjustment of the AD clock signal ACK. As N and L used in FIG. 4, N=3 and L=1.

In the rough adjustment stage S1, the phase of the AD clock signal ACK is shifted at the rough adjustment phase shift interval (interval that is three times the minimum unit interval of the phase shift) τ3 in such a way as A1 to A4 of P41 with the phases of the reference sample pulse DS1 and the peak sample pulse DS2 fixed at the first imaging phases to detect the phase at which the variance W3 becomes a minimum in the variance calculation (S12). If there are two variance-value sub-portions 31 and 32 at which the variance W3 becomes small as shown in FIG. 10, the luminance level at each phase detected with respect to both phases (A2 and A4 of P41) at which the variance W3 in each of the variance value sub-portions 31 and 32 becomes a minimum and the predetermined expected value are compared, and one phase is detected at each of the variance value sub-portions 31 and 32 as the first imaging phase in the rough adjustment stage S1. Here, A2 and A4 of P41 are detected as the first imaging phase.

Next, the phase of the AD clock signal ACK is shifted at the fine adjustment phase shift interval (minimum unit interval of the phase shift) τ0 in such a way as A5-1 to A7-1 and A5-2 to A7-2 of P42 and the variance W3 at each of the variance value sub-portions 31 and 32 is calculated (S12), and thereafter, the phase at which the calculated variance W3 becomes a minimum is detected at each of the variance value sub-portions 31 and 32. Furthermore, the luminance level at each detected phase and the predetermined expected value are compared to detect one phase as the second imaging phase in the fine adjustment stage S2 at each of the variance value sub-portions 31 and 32. Here, A5-1 and A7-2 of P42 are detected as the second imaging phase.

S/N is calculated at the second imaging phase (A5-1, A7-2 of P42) detected in the fine adjustment stage S2, and the phase at which the S/N becomes a larger value in the calculation result is determined as the optimum phase of the AD clock signal. Here, A7-2 of the phase P42 is determined as the optimum phase of the AD clock signal ACK.

However, if, for example, the AD clock signal ACK is adjusted to the phase in the variance value sub-portion 31 and the color of the retrieved image signal is G (green), and the AD clock signal ACK is adjusted to the phase in the variance value sub-portion 32 and the color of the retrieved image signal is R (red), the color of the image signal changes depending on whether A5-1 or A7-2 of P42 is made the optimum phase of the AD clock signal ACK. Since the order of colors of the image signal input from the analog front end 10 on the DSP 20 side is fixed, the colors might be inverted.

Therefore, the luminance levels of the phases detected at the respective variance value sub-portions 31 and 32 are compared to a predetermined expected value to judge colors, where when the color of the signal determined as the optimum phase of the AD clock signal ACK through comparison of the S/N differs from the color defined on the DSP 20 side, the setting on the DSP 20 side is changed to prevent color inversion of the image signal. The phase of the AD clock signal ACK can be adjusted at high precision through the above method.

In the above description, the digital still camera that does not require replacement of the imaging element 2 and the optical lens 1 has been described by way of example, but phase adjustment can be performed through the phase adjusting method described above in medical cameras in which replacement of the imaging element 2 and the optical lens 1 is required.

The embodiments described above are merely examples, and it should be recognized that various modifications can be made within the scope of the main purport of the invention.

Although the invention has been described in detail in its most preferred form, it is understood that arrangement of parts in the preferred form may be changed without deviating from the spirit and scope of the invention as hereinafter claimed.

What is claimed is:

1. A phase adjusting device for adjusting a phase of a pulse used in imaging of an analog imaged signal based on a digital imaged signal obtained by converting the analog imaged signal obtained by an imaging element to a digital value for every pixel, the phase adjusting device comprising:
   a characteristic detecting unit for detecting characteristics of the digital imaged signal at every phase shift interval set in advance;
   a timing adjustment unit for giving a phase adjustment instruction of the pulse so as to converge to an imaging phase in the digital imaged signal at which the characteristics are at a predetermined value or within a predetermined range; and
   a shift interval switching unit for switching the phase shift interval according to photographing conditions of the imaging element,
   wherein the shift interval switching unit switches the phase shift interval between a normal adjustment mode and a high speed adjustment mode of performing phase adjustment at high speed, divides an adjustment stage in the high speed adjustment mode into two stages of a rough adjustment stage and a fine adjustment stage following the rough adjustment stage, and sets a fine adjustment phase shift interval in the fine adjustment stage to an interval smaller than a rough adjustment phase shift interval in the rough adjustment stage.

2. The phase adjusting device according to claim 1, wherein
   the characteristic detecting unit sets a rough adjustment stage and a fine adjustment stage to be performed following the rough adjustment stage, detects a first imaging phase at which the characteristics sequentially detected at a rough phase shift interval become a first predetermined value or within a predetermined range in the rough adjustment stage, and detects a second imaging phase at which the characteristics sequentially detected at a fine adjustment phase interval having a narrower interval than the rough adjustment phase shift interval become a second predetermined value or within a second predetermined range with the first imaging phase as a center of the shift in the fine adjustment stage;
   the timing adjustment unit adjusts the phase of the pulse so as to converge to the second imaging phase; and
   the shift interval switching unit is omitted.

3. The phase adjusting device according to claim 1, wherein the fine adjustment phase shift interval is a minimum unit interval of a phase shift, and the rough adjustment phase shift interval is an integral multiple of the fine adjustment phase shift interval,
   where the integer is greater than or equal to two.

4. The phase adjusting device according to claim 3, wherein the rough adjustment phase shift interval is variable.

5. The phase adjusting device according to claim 1, wherein at least one of the rough adjustment stage and the fine adjustment stage is repeated a plurality of times.

6. The phase adjusting device according to claim 1, wherein the pulse is at least one of a peak sample pulse for detecting a level of the analog imaged signal and a reference sample pulse for detecting a signal level that becomes a reference when performing correlated double sampling on the analog imaged signal.

7. The phase adjusting device according to claim 1, wherein the characteristics are at least one of a luminance level of a pixel to be detected sequentially specified for every phase shift interval and a signal variance of a plurality of pixels sequentially specified for every phase shift interval.

8. The phase adjusting device according to claim 7, wherein the pulse is an AD clock signal to be provided to an external AD converter.

9. The phase adjusting device according to claim 1, wherein the shift interval switching unit switches the phase shift interval according to photographing conditions.

10. A phase adjustment driving device comprising:
    the phase adjusting device according to claim 1; and
    a timing generator for generating the pulse of at least one of a peak sample pulse for detecting a peak level of an imaged signal output from an imaging element, a reference sample pulse for detecting a signal level that becomes a reference of correlated double sampling, and an AD clock signal to be provided to an external AD converter.

11. A digital camera comprising:
the phase adjustment driving device according to claim 10;
the imaging element; and
a lens unit for collecting the light of a subject image on the imaging element.

12. A phase adjusting method for adjusting a phase of a pulse used in imaging; the method comprising the steps of:
detecting a first imaging phase at which characteristic of an image signal imaged using the pulse of each phase becomes a first predetermined value or within or above a first predetermined range while sequentially shifting the phase of the pulse at a rough adjustment phase shift interval set in advance; and
setting a second imaging phase at which the characteristic of the image signal imaged using the pulse of each phase becomes a second predetermined value or within a second predetermined range as an optimum phase while sequentially shifting the phase of the pulse at a fine adjustment phase shift interval smaller than the rough adjustment phase shift interval.
wherein the pulse is at least one of a peak sample pulse for detecting a level of the imaged signal and a reference sample pulse for detecting a signal level that becomes a reference when performing a correlated double sampling on the imaged signal.

13. The phase adjusting method according to claim 12, wherein the fine adjustment phase shift interval is a minimum unit interval of the phase shift, and the rough adjustment phase shift interval is an integral multiple of the fine adjustment phase shift interval, where the integer is greater than or equal to two.

14. The phase adjusting method according to claim 12, wherein at least one of the step of detecting the first imaging phase and the step of setting the optimum phase is repeated a plurality of times.

15. The phase adjusting method according to claim 12, further comprising the step of:
setting a third imaging phase at which the characteristic detected while sequentially shifting the phase of the pulse with the phase shift interval of the pulse fixed becomes a third predetermined value or within a third predetermined range as an optimum phase; wherein
setting the second imaging phase or the third imaging phase as the optimum phase is switched according to photographing conditions.

16. The phase adjusting method according to claim 12, wherein the characteristics are at least one of a luminance level of a pixel to be detected sequentially specified for every phase shift interval and a signal variance of a plurality of pixels sequentially specified for every phase shift interval.

17. A phase adjustment driving device comprising:
a phase adjusting device for adjusting a phase of a pulse used in imaging of an analog imaged signal based on a digital imaged signal obtained by converting the analog imaged signal obtained by an imaging element to a digital value for every pixel, the phase adjusting device comprising:
a characteristic detecting unit for detecting characteristics of the digital imaged signal at every phase shift interval set in advance;
a timing adjustment unit for giving a phase adjustment instruction of the pulse so as to converge to an imaging phase in the digital imaged signal at which the characteristics are at a predetermined value or within a predetermined range; and
a shift interval switching unit for switching the phase shift interval according to photographing conditions of the imaging element; and
a timing generator for generating the pulse of least one of a peak sample pulse for detecting a peak level of an imaged signal output from an imaging element, a reference sample pulse for detecting a signal level that becomes a reference of correlated double sampling, and an
AD clock signal to be provided to an external AD converter.

18. A digital camera comprising:
the phase adjustment driving device according to claim 17;
the imaging element; and
a lens unit for collecting the light of a subject image on the imaging element.

* * * * *